United States Patent [19]

Horiuchi et al.

[11] Patent Number: 4,827,082
[45] Date of Patent: May 2, 1989

[54] CERAMIC PACKAGE

[75] Inventors: Michio Horiuchi, Koshoku; Kihou Mizushima, Kamiminochi, both of Japan

[73] Assignee: Shinko Electric Industries, Co., Ltd., Nagano, Japan

[21] Appl. No.: 207,218

[22] Filed: Jun. 16, 1988

[30] Foreign Application Priority Data

Jun. 17, 1987 [JP] Japan .................. 62-150683

[51] Int. Cl.⁴ .................................. H01L 23/08
[52] U.S. Cl. ........................ 174/52.4; 357/74
[58] Field of Search .................. 174/52 FP; 357/74

[56] References Cited

U.S. PATENT DOCUMENTS

| | | | |
|---|---|---|---|
| 4,135,038 | 1/1979 | Takami et al. | 174/52 FP X |
| 4,460,916 | 7/1984 | Hashimoto et al. | 357/80 |
| 4,780,572 | 10/1988 | Kondo et al. | 174/52 FP |

OTHER PUBLICATIONS

Iwase et al., "Aluminum Nitride Multi-Layer Pin Grid Array Packages", Proceedings of 37th Electronic Components Conference, May 11-13, 1987, pp. 384-391.
Osaka et al., "Metalization of AlN Ceramics by Electroless Ni-P Plating", J. Electrochem. Soc., vol. 133, No. 11, Nov. 1986, pp. 2345-2349.
Mitsuru Ura, "High Thermal Conductive Ceramic Substrate Material", Engineering Material, vol. 34, No. 4, 1986, pp. 98-106 [The Nikkan Kogyo Shinbun, Ltd.].

*Primary Examiner*—Arthur T. Grimley
*Assistant Examiner*—David A. Tone
*Attorney, Agent, or Firm*—Staas & Halsey

[57] ABSTRACT

A ceramic package includes a high thermal conductive ceramic substrate (AlN or SiC sintered substrate) on which a semiconductor element is mounted, and a mullite sintered frame having metal conductive paths therein and joined to the substrate.

9 Claims, 1 Drawing Sheet

CERAMIC PACKAGE

BACKGROUND OF THE INVENTION

1. Field of the Invention

The present invention relates to a ceramic package for electronic parts.

2. Description of the Related Art

The recent demands for a higher density transistor, faster operation and inexpensive production costs for electronic parts, such as LSI semiconductor devices, require the ceramic packages to have the following properties: a lower dielectric constant, a higher thermal conductivity, a thermal expansion coefficient (expansivity) closer to that of a mounted semiconductor element (chip), a high mechanical strength, and a lower production cost. In addition, the ceramic packages must have a reliable hermetical sealing, encapsulation, and low $\alpha$-particle radio-activity.

As a material of the ceramic package, an aluminum nitride (AlN) sintered body or a silicon carbide (SiC) sintered body has begun to replace the conventional alumina sintered body, since properties of the AlN and SiC sintered bodies are superior to those of the alumina sintered body. For example, the AlN and SiC sintered bodies have a thermal conductivity of 140 W/mK or more, which is five or more times larger than that of an alumina sintered body, and have mechanical strength similar to or greater than that of an alumina sintered body. In addition, the thermal expansivity of the AlN (or SiC) sintered body is closer to that of a silicon semiconductor element than that of the alumina body, which is a favorable property for a package material.

Nevertheless, the AlN sintered body and the SiC sintered body are very expensive compared with the alumina sintered body, and thus, the production cost of the AlN (or SiC) package is also very high. Moreover, since the AlN and SiC sintered bodies have a high dielectric constant of 8.5–10 and 10–40 at 1 MHz, respectively, signal propagation delay-time is increased. Particularly, it is difficult to apply a conventional production method, in which green sheets are laminated for a ceramic package, to the SiC sintered body.

On the other hand, use has been made of a mullite sintered body, since the thermal expansivity thereof is ever closer to that of the silicon semiconductor element. Recently, the mullite material and production process have been improved, and it is now possible to obtain a mullite package having a dielectric constant of 7.0 or less at 1 MHz, thus meeting the demand for a faster operation of electronic parts. The mullite sintered body, however, has a thermal conductivity of 10 W/mK or less, which is inferior to that of the alumina sintered body, and has a flexural strength of less than 30 kg/mm$^2$, which is also inferior to that of the alumina sintered body. Therefore, although a mullite sintered body having a low dielectric constant and low thermal expansivity is suitable for a package on which a relatively large size semiconductor element is mounted, application of the mullite sintered body is limited due to the heat dissipation and mechanical strength thereof.

SUMMARY OF THE INVENTION

An object of the present invention is to overcome the above-mentioned disadvantages by providing an improved ceramic package.

Another object of the present invention is to provide a ceramic package having a low dielectric constant and good thermal conductivity, thus effectively satisfying the requirements for faster operation and higher density of the transistors of an electronic part.

The above-mentioned and other objects of the present invention are attained by providing a ceramic package which is comprised of: a substrate made of a highly thermal conductive ceramic material selected from the group consisting of sintered aluminum nitride and sintered silicon carbide, on which substrate a semiconductor element is mounted; and a frame of a mullite sintered body having metal electro-conductive paths therein and joined to said substrate.

According to the present invention, since the semiconductor element is mounted on the highly thermal conductive ceramic substrate, heat generated in the element is effectively dissipated through the substrate. Also, since the metal electro-conductive paths are formed within the mullite frame (sintered body) having a low dielectric constant, signal propagation delay-time is shortened.

BRIEF DESCRIPTION OF THE DRAWINGS

The present invention will become more apparent from the description of the preferred embodiments set forth below with reference to the accompanying drawings, in which.

DESCRIPTION OF THE PREFERRED EMBODIMENTS

Figure 1:
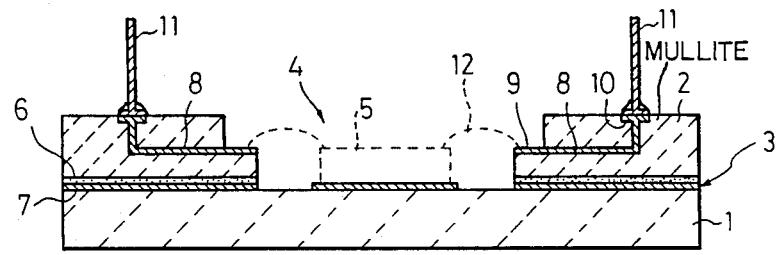
FIG. 1 is a schematic sectional view of a ceramic package without a lid, according to the present invention; and, FIG. 2 is a schematic sectional view of a ceramic package with a lid, according to the present invention.

Referring to FIG. 1, a ceramic package according to the present invention comprises a high thermal conductivity ceramic substrate 1 of an AlN sintered body, an SiC sintered body, or the like, and a mullite sintered frame 2 having a laminated structure and joined to the substrate 1 by a bonding medium 3. A cavity 4 for a semiconductor element 5 is formed in the frame 2 and on the substrate 1. In this case, the bonding medium 3 consists of a glass layer 6 and a plating layer 7 of, e.g., Ni-P. The mullite frame 2 includes metal electroconductive paths (i.e., metallized layers) 8 therein, which paths have a predetermined pattern. One end portion (pad) 9 of each of the paths 8 is exposed in the cavity 4 and the other end portion (pad) 10 is exposed at the top surface of the frame 2. Lead pins 11 are mounted on the pads 10 by brazing. The semiconductor element 5 is mounted on the ceramic substrate 1 by the plating layer 7 and a suitable solder or Au-Si eutectic (not shown), and bonding pads (not shown) of the element 5 are connected to the pads 9 of the paths 8 by wires 12, by a conventional wire bonding process.

Figure 2:
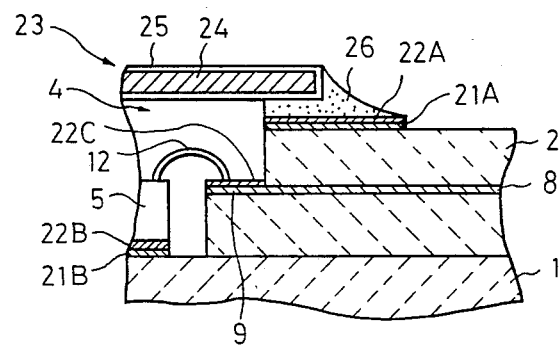

Referring to FIG. 2, a ceramic package according to another embodiment of the present invention comprises the high thermal conductivity ceramic substrate 1 and the mullite sintered frame 2 which is directly joined to the substrate 1. In this case, metallized layers 21A and 21B of, e.g., W, are selectively formed on the substrate 1 and the frame 2, and plating doublelayers 22A, 22B and 22C of an Ni plating layer and an Au plating layer are formed on the metallized layers 21A and 21B and the pads 9 of the paths 8, respectively. The semiconductor element 5 is fixed on the plating layer 22B by a suitable solder or Au-Si eutectic (not shown). The wire 12 connects one of the bonding pads of the elements 5 and one of the pads 9. A prepared lid (cap) 23 is placed on the frame 2 and the cavity 4 and is hermetically sealed by a sealing medium 26. In this case, the lid 23 consists of a metal plate 24 of, e.g., Fe-Ni-Co alloy (Kovar), and a plating double layer 25 of an Ni plating layer and an Au plating layer. The sealing medium 26 of Au-Su alloy solder is set between the plating layers 22A and 25, to set the lid 23 on the frame 2. This hermetic sealing technique can be applied to the package of FIG. 1.

Sintering of the mullite sintered body is usually carried out at a temperature of from 1400° to 1600° C., and sintering of the AlN or SiC sintered body is usually carried out at a temperature of 1700° C. or more. The mullite sintered frame is produced by a conventional multilayer ceramic technology; for example, slurry of a ceramic powder, binder sintering promoter, plasticizing agent, dispersant, and a solvent is prepared, and green sheets are then formed from the slurry. After drying, the sheets are cut to a desired size and then a conductive paste, such as a tungsten paste and molybdenum-manganese paste, is applied to the green sheets by, e.g., a screen printing process. Several of these sheets are then press-laminated together to form one body, and the laminated body is fired (sintered) to form a monolithic mullite sintered body.

Since the thermal expansivity of the obtained sintered body can be controlled by the ceramic powder composition, a method of producing the mullite powder, sintering promoter or the like, can be used by which it is possible to prevent the reduction of the joining strength between the mullite sintered body and the high thermal conductive ceramic substrate caused by difference of the thermal expansivities of the mullite body and the substrate. Accordingly, the ceramic powder composition, etc., is preferably determined, so that the thermal expansivity of the mullite sintered body becomes closer to that of the ceramic substrate. On the other hand, it is possible to control the thermal expansivity of the high thermal conductive ceramic substrate (the AlN sintered body or the SiC sintered body) by varying the composition of the raw ceramic powder, etc.

To join the mullite sintered frame and the ceramic substrate into one body as a ceramic package, the following three methods are generally used.

A. The mullite sintered frame and the AlN (or SiC) sintered body (i.e., substrate) are prepared, and the frame and the substrate are joined by a bonding medium, such as a glass and solder (alloy), at a temperature of 1000° C. or less. Note, the AlN sintered body (substrate) has a very low wettability by molten glass or molten solder at a temperature of 1000° C. or less, and therefore, a plating layer of, e.g., Ni-P, is formed on the AlN sintered body, to overcome this low wettability defect.

B. The mullite sintered frame and the AlN (or SiC) sintered body (substrate) are prepared, and a bonding medium of, e.g., a magnesium or yttrium oxide-containing layer is applied between the frame and the substrate, which are then heated at a temperature of 1600° C. or more under a neutral atmosphere. In this case, the contained magnesium or yttrium oxide reacts at a high temperature with the mullite, to form a liquid phase, as a bonding medium.

C. The AlN (or SiC) sintered body (substrate) is prepared, and a laminated frame body consisting of mullite green sheets and conductive paste patterns is prepared. The laminate frame body is placed on the substrate and they are then heated at a sintering temperature of mullite under a nonoxidizing atmosphere. Accordingly, the sintering of the mullite frame and the direct joining of the frame to the substrate are simultaneously performed.

Where the heating temperature is 1000° C. or more, a non-oxide, such as AlN and SiC may be oxidized. To prevent such oxidation, a neutral or reducing atmosphere must be present during the heating treatment.

Where a joining area between the mullite sintered frame and the high thermal conductive ceramic substrate is limited by the package design, preferably the surface roughness of the frame and the substrate are varied, to increase the joining strength.

In addition, where glass or solder is used for the joining, the properties, especially, the thermal expansivity thereof, must be considered.

A ceramic package according to the present invention is produced in the following manner.

First, to obtain an AlN sintered substrate, 50 g of AlN powder having an average grain size of 2 $\mu$m or less, 1.5 g of calcium carbonate powder and 40 ml of 1-butanol are mixed in a ball mill using a resin pot and resin balls for 20 hours. The mixed powder is dried, and 5 g of the mixed powder is charged into a hot press machine and sintered at 1800° C. under a pressure of 300 kg/cm$^2$ under a nitrogen atmosphere, to obtain an AlN sintered substrate having a size of 35 mm×35 mm×1.3 mm. To improve the wettability of the AlN substrate, the substrate is immersed in an NaOH solution and then selectively covered with an electroless plating layer of Ni-P.

On the other hand, to obtain a mullite sintered frame, 200 g of mullite powder containing 2 wt% of magnesium oxide and having an average grain size of 2 $\mu$m or less, 7 ml of di(2-butyl)phthalate, 120 ml of a mixed solution of 1-butanol and toluene are mixed in an alumina ball mill for 20 hours, and then 18 g of resin powder of polyvinyl butyral is added in the ball mill and mixed for 24 hours, and after deaeration of the obtained slurry, a green sheet is formed from the slurry by a doctor blade method. After drying, the green sheet had a thickness of 0.7 mm. The green sheet is cut to a size of 110 mm×110 mm and then metal conductive paths of tungsten paste having a grain size of 0.6 $\mu$m applied on the cut green sheet by a screen printing process. The obtained green sheet is cut into pieces having desired sizes, which pieces have outside dimensions of 41 mm×41 mm, and these pieces are laminated by hot pressing into one body. The laminated body is then sintered at 1600° C. for 5 hours under the neutral atmosphere, and thus a mullite sintered frame including metal conductive paths therein is obtained.

The obtained AlN sintered substrate and mullite sintered frame have the properties shown in Table 1.

TABLE 1

| Properties | Material | |
|---|---|---|
| | AlN | Mullite |
| Thermal Conductivity (W/mK) | 170 | 6.5 |
| Thermal Expansivity ($\times 10^{-6}$/°C.) | 4.5 | 4.5 |
| Flexural Strength (kg/mm$^2$) | 40 | 20 |
| Dielectric Constant (at 1 MHz) | 9.0 | 7.3 |

Next, a thin paste of borosilicate lead glass is applied on the joining surface of the mullite sintered frame and the frame with the glass layer placed on the plating layer of the AlN sintered substrate. The entire structure is heated at 600° C. for 5 hours in N₂ to obtain a ceramic package made of the substrate and the frame joined with the glass bonding layer.

The strength of the joint of the obtained ceramic package is such that peeling of the frame from the joint interface does not occur regardless of the tensile stress applied, but instead, a portion of the mullite sintered frame is broken away.

Thereafter, lead pins are fixed, a semiconductor element is mounted, a lid is set, and the package hermetically sealed in a conventional manner. For example, an Ni plating layer and an Au plating layer are formed on the Ni-P plating layer, pads of the conductive paths (i.e., tungsten metallized layers) and a tungsten metallized portion surrounding the cavity of the package on the frame and formed in the process of making the mullite sintering frame. The pins of Fe-Ni-Co alloy are fixed on the pads exposed at the top surface of the frame by a solder (e.g., Ag-Cu alloy solder) at a temperature of 800°-900° C., and the semiconductor element is mounted on the Au plating layer within the cavity, by a suitable solder or Au-Si eutectic. Pads of the semiconductor elements and the Au plating layer on the pad of the conductive paths are connected with wires by a wire-bonding process. Then, a prepared lid made of Fe-Ni-Co alloy (KOVAR) covered with an Ni under plating layer and an Au upper plating layer is set on the Au plating layer surrounding the cavity, through a solder (e.g., Au-Sn alloy solder). Finally, the entire structure is heated at a temperature of 250°-300° C. to hermetically seal the package with the lid and the solder.

The ceramic package according to the present invention has a monolithic body of a high thermal conductivity ceramic plate and a mullite sintered frame, which brings the following advantages.

A. Required properties, i.e., high heat dissipation and low dielectric constant, of a ceramic package are both provided. Namely, a semiconductor element is mounted on the high thermal conductivity ceramic (AlN or SiC) substrate, and thus, the heat generated in the elements is dissipated through the ceramic substrate. Accordingly, a high density semiconductor element with a high heat release value can be mounted on the package according to the present invention. Since the metal conductive paths are formed within the mullite sintered frame having a low dielectric constant, the signal propagation delay-time is shortened, which meets the need for a faster operation of an electronic part.

B. The ceramic package of the present invention can be produced at a lower cost, compared with a ceramic package made of an expensive high conductivity ceramic material alone.

C. Since both the high conductivity ceramic substrate and the mullite sintered frame have a thermal expansivity closer to that of silicon, the ceramic package of the present invention can be used for mounting a large silicon semiconductor element, such as an IC chip, LSI chip, and VLSI chip.

D. The ceramic package of the present invention has a superior mechanical strength, compared with a ceramic package in made of a mullite sintered body alone.

Accordingly, the ceramic package of the present invention provides an improved performance of a semiconductor element (device) contained in the package and increases the reliability of the semiconductor element or an electronic part.

It will be obvious that the present invention is not restricted to the above-mentioned embodiments and that many variations are possible for persons skilled in the art without departing from the scope of the invention.

We claim:

1. A ceramic package comprising:
   a substrate made of a highly thermal conductive ceramic material selected from the group consisting of sintered aluminum nitride and sintered silicon carbide;
   at least one semiconductor element mounted on the substrate; and
   a frame made of a mullite sintered body having metal conductive paths therein and joined to said substrate.

2. A ceramic package according to claim 1, wherein said frame is a multilayer body and said paths have opposite end pads, one of which is connectable to said at least one semiconductor element.

3. A ceramic package according to claim 2, further comprising a lid placed on said frame over the at least one semiconductor element, and hermetic sealing means for joining said lid to said frame hermetic sealing.

4. A ceramic package according to claim 2, further comprising wires for connecting said at least one semiconductor element and said opposite end pad.

5. A ceramic package according to claim 1, further comprising a bonding medium for bonding said frame to said substrate, said bonding medium being selected from the group consisting of glass and a brazing metal and being placed between said frame and said substrate.

6. A ceramic package according to claim 5, further comprising a nickel-phosphorus plating layer selectively formed on said substrate and under said bonding medium.

7. A ceramic package according to claim 1, wherein said frame is directly joined to said substrate.

8. A ceramic package according to claim 1, wherein said frame is joined to said substrate by a magnesium oxide-containing layer formed therebetween.

9. A ceramic package according to claim 1, wherein said frame is joined to said substrate by a yttrium oxide-containing layer formed therebetween.

* * * * *